United States Patent [19]
Allen, III

[11] Patent Number: 5,493,519
[45] Date of Patent: Feb. 20, 1996

[54] HIGH VOLTAGE DRIVER CIRCUIT WITH FAST CURRENT LIMITING FOR TESTING OF INTEGRATED CIRCUITS

[75] Inventor: Ernest Allen, III, Santa Cruz, Calif.

[73] Assignee: Altera Corporation, San Jose, Calif.

[21] Appl. No.: 107,385

[22] Filed: Aug. 16, 1993

[51] Int. Cl.[6] .................... G01R 19/00; G06F 17/00
[52] U.S. Cl. .................... 364/579; 324/73.1; 371/27
[58] Field of Search ............... 371/27, 15.1; 324/73.1, 324/754, 555; 364/579, 580

[56] References Cited

U.S. PATENT DOCUMENTS

| | | | |
|---|---|---|---|
| 3,676,777 | 7/1972 | Charters | 324/754 |
| 4,472,678 | 9/1984 | Lauriello | 324/72.5 |
| 4,520,416 | 5/1985 | Karash | 361/11 |
| 4,572,971 | 2/1986 | Necoechea | 307/260 |
| 4,605,894 | 8/1986 | Cox et al. | 324/72.5 |
| 4,637,020 | 1/1987 | Schinabeck | 364/579 X |
| 4,646,299 | 2/1987 | Schinabeck et al. | 364/579 X |
| 4,896,244 | 1/1990 | Kalina | 361/98 |
| 5,010,297 | 4/1991 | Babcock | 324/73.1 X |

*Primary Examiner*—Ellis B. Ramirez
*Assistant Examiner*—Edward Pipala
*Attorney, Agent, or Firm*—Townsend and Townsend and Crew

[57] ABSTRACT

A circuit that provides for digitally programmable high voltage drive, as well as fast current limiting capability for testing of integrated circuits. The circuit also provides for digitally programmable slew rate control for controlling the rise and fall times of an output voltage. Integrated circuits requiring low voltage and high voltage tests at different speeds and with different current limiting conditions, or low and high current forcing with different voltage clamp levels, or a mixture of the two can be tested in a single continuous test pattern using the circuit of the present invention.

9 Claims, 4 Drawing Sheets

HIGH VOLTAGE DRIVER CIRCUIT WITH FAST CURRENT LIMITING FOR TESTING OF INTEGRATED CIRCUITS

BACKGROUND OF THE INVENTION

This invention relates generally to circuits used for testing of integrated circuits. More particularly, this invention provides a digitally programmable high voltage driver circuit with digitally programmable slew rate and digitally programmable current limiting.

Programming and testing of certain types of integrated circuits may require application of a wide range of voltages with controlled amounts of currents to the device under test (DUT) that are not provided by typical ATE systems. For example, programmable logic array (PLA) devices that use fusible links or electrically erasable programmable read only memory (EEPROM) cells may require application of voltages in the range of 8 to 15 volts or precise amounts of currents under a specific controlled pattern for programming and testing purposes. The corresponding programming current ($I_{pp}$) specified for a particular pin may vary from, for example, 1 mA to 100 mA. During normal operation, the same pin may act as a configurable I/O pin required to source and sink currents with more than an order of magnitude difference in amount. Therefore, the testing of such pins often requires setting variable current limits. Furthermore, due to operation under high voltages, these devices typically employ high-voltage protection circuitry to prevent adverse affects such as latch-up. The high-voltage protection circuitry requires a minimum turn-on time to operate properly. Also, while fast operation requires fast signal rise and fall times (i.e. higher slew rates), preventing overshoot demands slower signal transitions in some cases. Thus, it would be desirable to have voltages with varying and well controlled slew rates applied to the DUT. Preventing latch-up conditions is another reason for providing current limiting capability. The differing I/V requirements for the two different modes of operation (i.e. programming mode and normal operating mode) in programmable logic devices result in complex test patterns.

Existing ATE systems are not designed to support the types of programming and testing requirements mentioned above. A single test pattern that tests for conditions under both programming and normal operating modes can not be applied to the same pin of the DUT without interrupting test execution and reprogramming the variables when switching from one mode to the other. Moreover, typical logic testers provide output voltages in the range of 0 to 5 volts only. Also, current limiting in applications such as those discussed above can be achieved by, for example, using current-limiting resistors at the output of the ATE voltage driver channels. However, such techniques do not provide a satisfactory solution to the problem of ensuring application of controlled amounts of current for a controlled period of time. One problem is due to the fact that the duration of time the programming current, $I_{pp}$, is applied to a programming element, such as an antifuse, is typically controlled by the pulse width of the signal applied to the pin. Since the tester has no way of detecting exactly when the antifuse is blown, if the antifuse blows quickly, the programming current may run through the antifuse for a longer period of time than intended. Excessive amounts of currents through a blown antifuse may cause annealing of the antifuse. Furthermore, programmability of the slew rate of signals generated by testers is not a feature that is available in typical ATE. As a result, every time slew rate requirements for a test signal change, the tester variables must be reprogrammed and a different set of passive components (resistors or capacitors) switched in via relays.

The above shortcomings of existing ATE systems have led to use of additional customized hardware as well as cumbersome and inefficient programming and testing algorithms in order to integrate specialized testing requirements into the existing ATE test environment. Manufacturing costs are therefore increased due to additional required test hardware and increased use of tester time.

From the foregoing, it can be appreciated that there is a need for a high voltage driver circuit with programmable current limiting switchable during a continuous test pattern (i.e. "on the fly") that improves the versatility and efficiency of automatic test equipment.

SUMMARY OF THE INVENTION

The present invention provides a high voltage driver circuit with fast programmable current limiting capability for testing of integrated circuits. The circuit of this invention can perform variable voltage tests, at a wide range of voltages, with variable current limiting levels, on a single device pin during a continuous test pattern.

In one embodiment, the present invention provides a processor-controlled circuit for testing of integrated circuits that includes a four-terminal diode bridge with one terminal connecting to a device under test (DUT), a digitally programmable current source connected to another terminal of the diode bridge, a digitally programmable reference voltage generator connected to a third terminal of the diode bridge, and another digitally programmable current source connected to the fourth terminal of the diode bridge. Digital programmability is provided for by the combination of recirculating registers that receive digital control data from the processor, and digital to analog converters (DACs) that control the current sources and voltage generator. The programmable current sources include current mirror (or high impedance cascode current source) circuits that are connected to provide variable current sourcing and sinking ability. The reference voltage generator includes an amplifier to provide for high voltage drive capability.

The circuit of the present invention further includes a digitally programmable slew rate circuit that comprises a diode-bridge, recirculating register and a DAC, outputs of which connect to two terminals of the four-diode bridge. The DAC outputs control the amount of current feeding a capacitor that connects to the input of a voltage follower that drives the DUT pin.

The present invention serves equally well in the current domain, where the programmed voltage acts as a clamp circuit. Thus this invention is also a high speed, multi-level current source with variable voltage clamp levels.

Furthermore, the specific embodiment of the present invention requires the use of only one extra tester pin to act as controller and timer during high voltage operations, and normal use of both pins is still possible when such high voltage capability is not needed.

A further understanding of the nature and advantages of the present invention may be gained by reference to the detailed description and diagrams below.

DESCRIPTION OF THE SPECIFIC EMBODIMENTS

Figure 1:
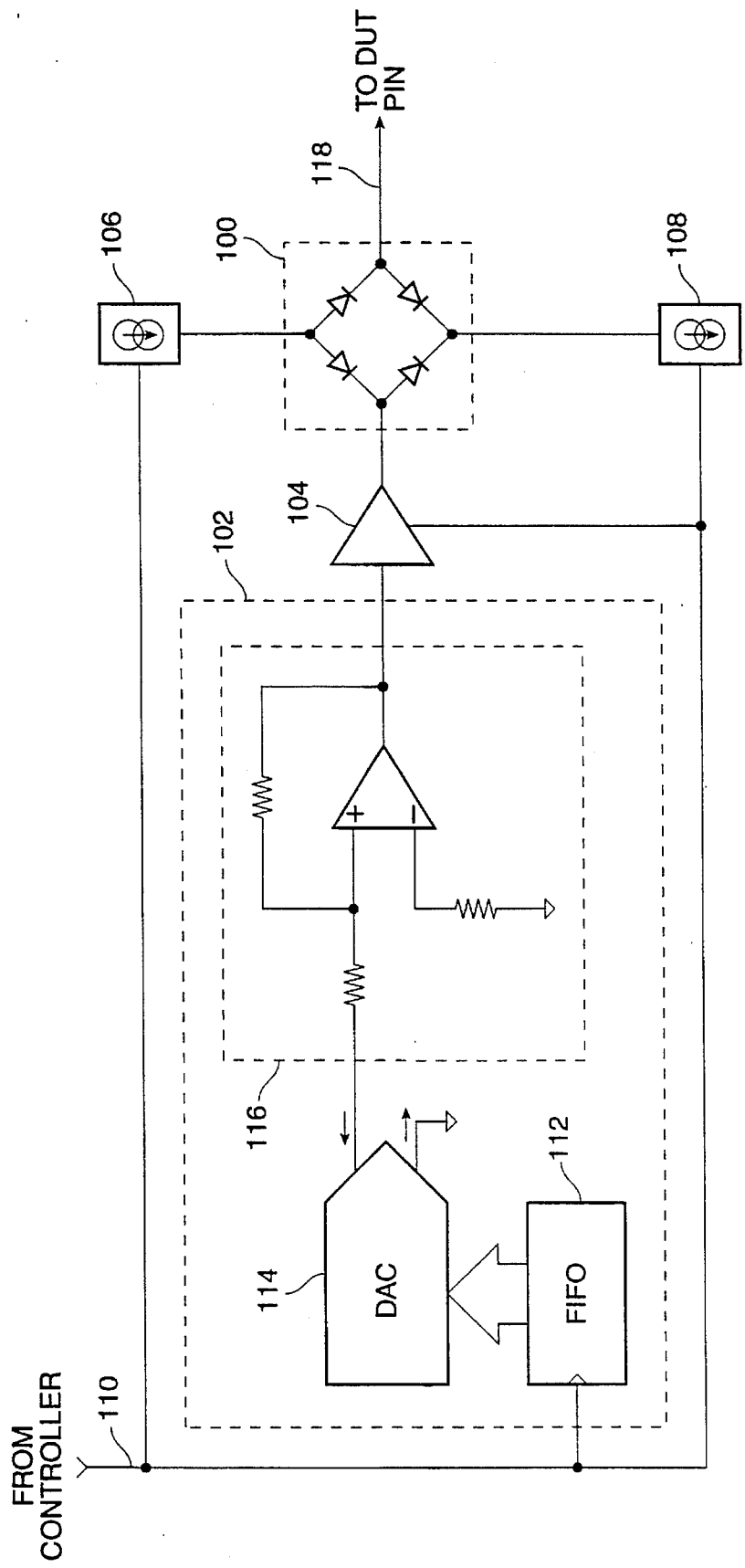
FIG. 1 is a block diagram of the present invention showing the programmable high voltage drive circuit.

In a preferred embodiment, the present invention provides a digitally programmable voltage driver and current limiting circuit for testing of integrated circuits. FIG. 1 is a block diagram of the circuit of the present invention showing one embodiment of the high voltage driver circuit. The circuit includes a four-terminal diode bridge 100 as found in a tester channel of most current ATE systems. A digitally programmable voltage driver circuit 102 connects to one terminal of the diode bridge 100 through a digitally programmable slew rate control block 104. Two other terminals of the diode bridge 100 connect to a digitally programmable current source block 106 and a digitally programmable current sink block 108, respectively. A controller pin 110 of a processor (not shown) connects to all digital programmable blocks 102, 104, 106 and 108. The last terminal 118 of the diode bridge 100 connects to a pin of the device under test (DUT). This terminal may also connect to other testing resources for taking different measurements.

Digitally programmable voltage driver 102 includes a recirculating first-in first-out (FIFO) register 112 that receives digital control data through control pin 110. The register 112 then feeds the control data to a digital to analog converter (DAC) 114. The analog output of DAC 114 is amplified by amplifier block 116. The voltage at the output of amplifier 116 drives the DUT pin (118) through the slew rate control block 104 and diode bridge 100.

Figure 2:
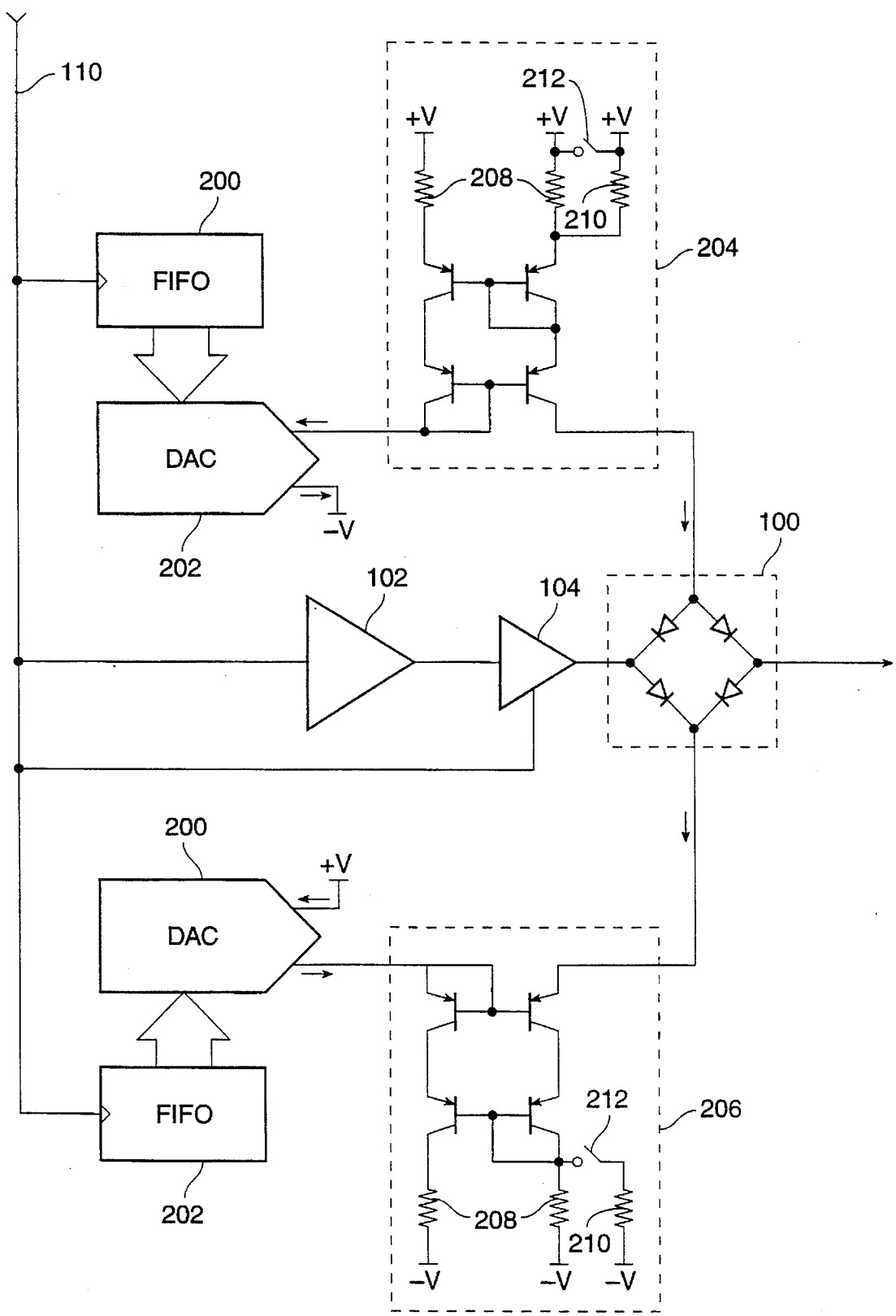
FIG. 2 is a block diagram of the present invention showing the digitally programmable current limiting circuit.

Implementation of the digital programmability of the current source and sink blocks 106 and 108 is similar to the high voltage drive circuit 102. FIG. 2 is a block diagram of the circuit showing the details of the current source and sink blocks 106 and 108. Two similar FIFO register 200, DAC 202 combinations control an amount of current through current mirror/multiplier circuits 204 and 206 for current source and sink blocks 106 and 108, respectively. Improved current mirroring is achieved by high impedance cascode current source structures. The cascode current source structures include emitter resistors 208 as shown, to further improve the output impedance of the current source. They further include additional emitter resistors 210 at the output leg of the current source to provide for current multiplication. By closing a switch 212 that connects resistor 210 in parallel to the existing emitter resistor 208, the amount of current can be changed in one large step. If the value of resistor 210 is, for example, an order of magnitude less than resistor 208, the value of the output current will increase by approximately an order of magnitude.

Figure 3:
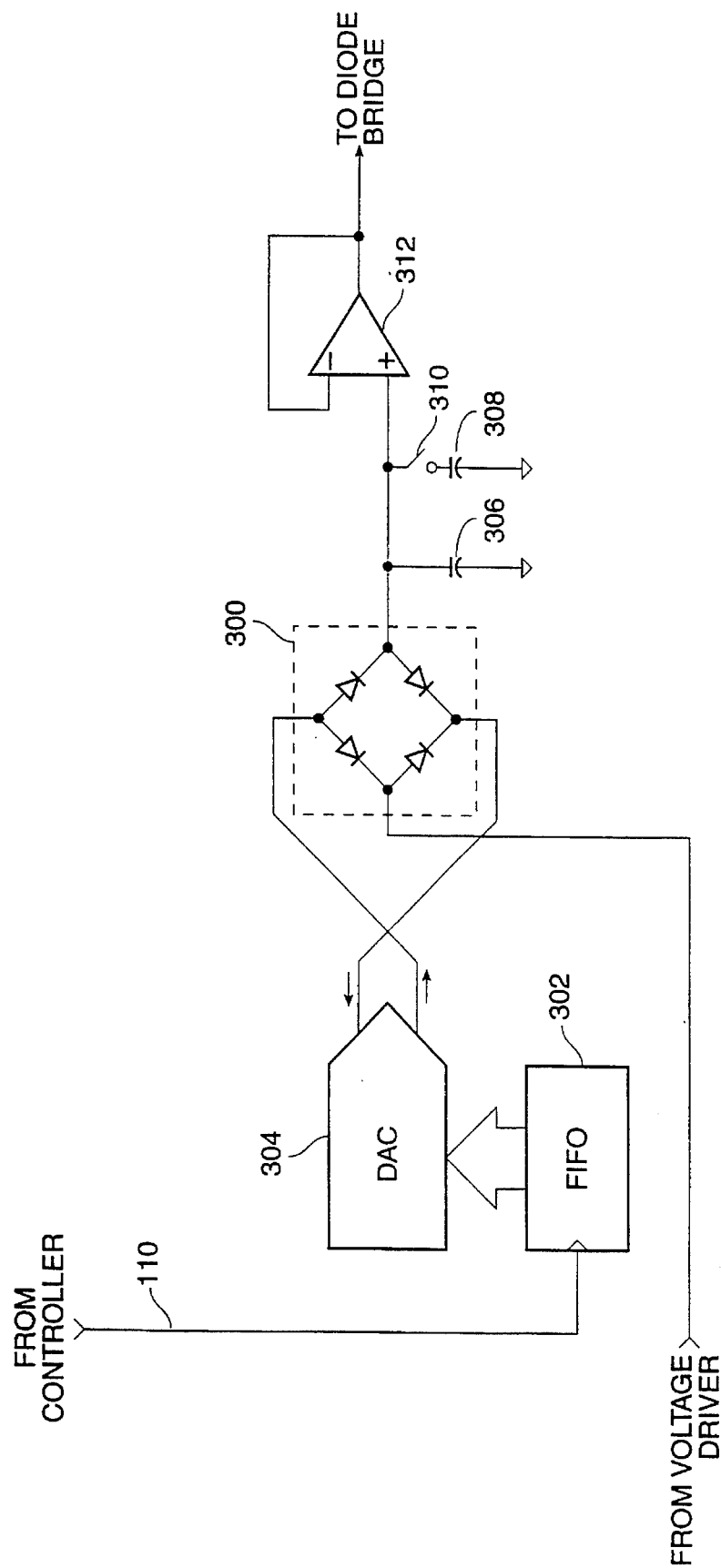
FIG. 3 is a schematic diagram of the digitally programmable slew rate circuit.

FIG. 3 is a schematic diagram of the digitally programmable slew rate control block 104. A FIFO register 302 and a DAC 304 provide for digital programmability. DAC 304 has two complementary outputs having equal and opposite current outputs. These two outputs connect to two opposite terminals of a secondary four-terminal bridge 300. A third terminal of diode bridge 300 connects to the output of the voltage driver block 102, while the fourth terminal connects to a capacitor 306 and a positive input of a unity gain buffer amplifier 312. A second capacitor 308 can be connected in parallel to capacitor 306 via a switch 310. The amount of current at the outputs of DAC 304 and the value of the capacitors 306 and 310 control the slew rate of the signal driving the DUT pin (118). The switch 310, capacitor 308 combination provide for a coarse control over the range within which the slew rate varies. The equal and opposite currents at the outputs of DAC 304 provide for equal rates of charge and discharge ensuring equal slew rates in both directions.

One embodiment of the present invention incorporates the digitally programmable high voltage driver 103, slew rate control block 104 and current source and sink blocks 106 and 108 into an ATE system. Each ATE channel typically includes a four-terminal diode bridge that can be used as diode bridge 100. In this embodiment, the fourth terminal of the diode bridge 100 connects to a tester pin electronics card and the controller pin 110 is driven by another tester pin electronics card. Therefore, existing ATE vendor's software can readily support this circuit allowing for standard programming of all sections of the circuit of the present invention.

In operation, a test program loads each recirculating FIFO register prior to pattern execution. A length (or depth) is also programmed into each FIFO to enable the tester to restart operation without having to go through the full range of the FIFO. Data is then clocked out at standard edge rates as desired, for example, by placing the controller pin 110 in Pulse Low or Pulse High format. Each DAC translates the digital data into analog output to control the respective circuit. The response of the circuit is therefore limited by the settling time of the DACs, which can be as small as, for example, 100 nS to 1 LSB with off the shelf components such as the DAC0800. Switching between transistor-transistor-logic (TTL) levels and higher programming voltages ($V_{hh}$) is readily accomplished by: 1) tri-stating the driver and supplying a low- (or high-) going edge on the control pin electronics 110 to go from TTL to $V_{hh}$, and 2) by shutting off the two current sources 106 and 108 (by loading zeros into their respective FIFO's), to go from $V_{hh}$ back to TTL levels.

Figure 4:
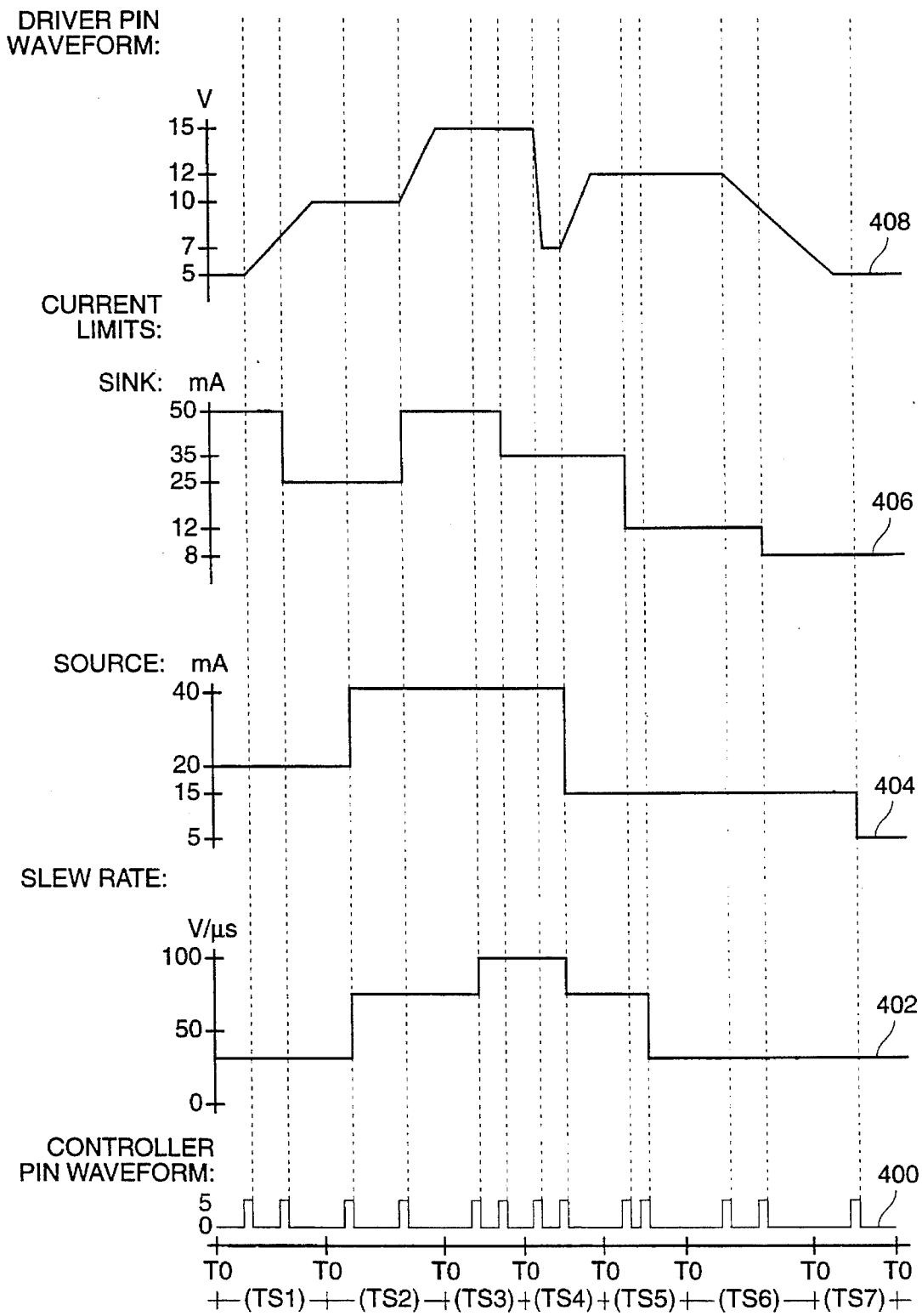
FIG. 4 is a timing diagram of an illustrative test pattern made possible by the circuit of the present invention.

The circuit of the present invention enables the user to construct virtually any piecewise linear wave form, together with any desired pair of (source and sink) current limits. The complexity of the waveform will be limited only by the size of the FIFOs used. With 256 word FIFOs commonly available, and the ability to set an arbitrary "depth" to the FIFO (for example by feeding one output digit back to the reset input), very complex waveforms and test patterns can be developed. The user can also couple the timeset address for the high voltage pin so that it specifies the entry point into the FIFO. FIG. 4 shows an example of a set of waveforms at the outputs of the voltage driver, current source and sink limiting circuits, and the slew rate controller, with a controller timing waveform shown along the bottom. The control pin electronics card provides for very accurate control over the time domain. Since pin multiplexing is a common practice, almost all existing ATE vendors provide a method for the waveform edges of one pin to be available on a neighboring pin. Waveform 400 is an example of a controller pin waveform which includes a series of pulses at different times. New data is loaded into all four FIFOs upon, for example, the falling edge of each pulse. Initially, the signal at the output pin 118 (FIG. 1) is shown at 5 volts (waveform 408) with a sink current limit of 50 mA (waveform 406) and source current limit of 20 mA (waveform 404). All standard TTL test operations may take place under these conditions. On the first pulse of control pin waveform 400, data representing 10 volts is clocked from the FIFO 112 into DAC 114 of the voltage driver 102. The slew rate is set at approximately 30 v/μS as shown on waveform 402, and the current limits remain unchanged. As the voltage ramps up toward 10 volts, a second pulse modifies the sink current limit (waveform 406) from 50 mA to 25 mA. Each succeeding pulse changes these parameters according to the user's program. It is therefore possible to perform voltage tests in the range of, for example, 5 to 15 volts, with current limiting in either direction in the range of about 5 to 50 mA. Rise and fall times of the output voltage can be controlled within a range of, for example, 0 to 100 v/μS. Waveform 408 illustrates an example of an output voltage whose level, slew rate and current limits are digitally modified in a single continuous pattern.

In conclusion, the present invention provides an efficient and low cost solution to the problem of generating repetitive and highly complex waveforms for testing of integrated circuits. A high voltage driver circuit is capable of fast programmable current limiting. The circuit of this invention can perform variable voltage tests, at a wide range of voltages, with variable current limiting levels, on a single device pin during a continuous test pattern. It also provides for the capability to switch between voltage-forcing and current-forcing modes "on the fly." While the above is a complete description of the preferred embodiments of the present invention, it is possible to use various alternatives, modifications and equivalents. For example, the current source and sink circuits 204 and 206 (FIG. 2) can be implemented using NPN bipolar transistors, or to improve current mirroring, composite PNP-NPN transistors can be used as in class B amplifiers. Therefore, the scope of the present invention should be determined not with reference to the above description but should, instead, be determined with reference to the appended claims, along with their full scope of equivalents.

What is claimed is:

1. In a test system having a diode bridge wherein an integrated circuit under test couples to a first terminal of the diode bridge, a method for testing the integrated circuit comprising the steps of:

(a) loading first digital test data into a first register;

(b) using a digital to analog converter to convert said first digital test data to first analog current signal;

(c) directly applying said first analog current signal to a current-controlled current mirror circuit;

(d) coupling an output of said current-controlled current mirror circuit to a second terminal of the diode bridge; and (e) varying an amount of current flowing through said current-controlled current mirror circuit to change test parameters at substantially the same speed as the speed of execution of the functional test.

2. The method of claim 1 further comprising the steps of:

(f) providing a current-controlled high voltage driver;

(g) loading second digital test data into a second register;

(h) using a digital to analog converter to covert said second digital test data to second analog current signal;

(i) directly applying said second analog current signal to said current-controlled high voltage driver;

(j) driving a selected pin of the integrated circuit under test by an output voltage of said current-controlled high voltage driver via a third terminal of the diode bridge; and (k) varying an amount of current flowing through said current-controlled high voltage driver to change said output voltage at substantially the same speed as the speed of execution of the functional test.

3. A processor-controlled circuit for testing of integrated circuits, comprising:

a diode bridge having a first terminal coupled to a device under test;

a digitally programmable current-controlled current source coupled to a second terminal of said diode bridge;

a digitally programmable reference voltage generator coupled to a third terminal of said diode bridge; and a digitally programmable current-controlled current sink coupled to a fourth terminal of said diode bridge, each one of said digitally programmable current-controlled current source and current sink comprises:

a register coupled to the processor, for storing programming data;

a digital to analog converter having a digital input coupled to said register, and an analog current output; and a current-controlled current mirror circuit having a first terminal coupled to said analog current output of said digital to analog converter and a second terminal coupled to a terminal of said diode bridge, wherein, in response to said programming data, said digital to analog converter is capable of varying an amount of current flowing through said current mirror circuit to change test parameters during the execution of a functional test at substantially the same speed as the speed of execution of the functional test.

4. The circuit of claim 3 wherein said current-controlled current mirror circuit further comprises:

a first and second degeneration resistors respectively coupling each leg of said current-controlled current mirror circuit to a power supply voltage; and a current-multiplier resistor coupled in parallel to a selected one of said first and second degeneration resistor through a switch.

5. The circuit of claim 3 wherein said register is a recirculating first-in first-out register.

6. The circuit of claim 3 wherein said digitally programmable reference voltage generator comprises:

a second register, coupled to the processor, for storing programming data;

a second digital to analog converter coupled to said second register; and an amplifier circuit having an input terminal coupled to said second digital to analog converter and an output terminal coupled to said third terminal of said diode bridge, wherein, in response to said programming data, said second digital to analog converter controls a level of voltage at said amplifier output terminal.

7. The circuit of claim 3 further comprising a digitally programmable slew rate control circuit coupled between said digitally programmable reference voltage generator and said diode bridge third terminal.

8. The circuit of claim 7, wherein said digitally programmable slew rate control circuit comprises:

a second diode bridge having a first terminal coupled to an output of said digitally programmable reference voltage generator;

a third register, coupled to said processor, for storing programming data;

a third digital to analog converter having a multi-bit input coupled to said third register and two complementary outputs coupled to a second and a third terminal of said second diode bridge, respectively;

at least one capacitor coupled to a fourth terminal of said second diode bridge; and a buffer coupling said capacitor to said first diode bridge third terminal.

9. The circuit of claim 8 further comprising a second capacitor coupled in parallel to said at least one capacitor through a switch.

* * * * *